(12) United States Patent
Bencher et al.

(10) Patent No.: US 7,901,869 B2
(45) Date of Patent: Mar. 8, 2011

(54) DOUBLE PATTERNING WITH A DOUBLE LAYER CAP ON CARBONACEOUS HARDMASK

(75) Inventors: Christopher D. Bencher, San Jose, CA (US); Huixiong Dai, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 597 days.

(21) Appl. No.: 11/873,648

(22) Filed: Oct. 17, 2007

(65) Prior Publication Data
US 2008/0299494 A1    Dec. 4, 2008

Related U.S. Application Data (60) Provisional application No. 60/932,859, filed on Jun. 1, 2007.

(51) Int. Cl.
G03F 7/26 (2006.01)
C23C 16/00 (2006.01)

(52) U.S. Cl. ............. 430/313; 430/394; 427/249.1
(58) Field of Classification Search .......... 430/311, 430/314, 313, 394
See application file for complete search history.

(56) References Cited

U.S. PATENT DOCUMENTS

| 6,110,828 | A  | * | 8/2000 | Guo et al. ............ 438/688 |
| 2002/0164868 | A1 | * | 11/2002 | Chang et al. ............ 438/622 |
| 2005/0048771 | A1 | * | 3/2005 | Gao et al. ............ 438/671 |
| 2005/0167394 | A1 | * | 8/2005 | Liu et al. ............ 216/41 |
| 2007/0077526 | A1 |   | 4/2007 | Finders |

OTHER PUBLICATIONS

"Double-paterning lithography," Imec, http://www.imec.be/ww-winter/mediacenter/en/SR2006/681406.html, printed Apr. 18, 2007, 3 pgs.

* cited by examiner

Primary Examiner — Kathleen Duda
Assistant Examiner — Caleen O Sullivan
(74) Attorney, Agent, or Firm — Blakely Sokoloff Taylor & Zafman, LLP (57) ABSTRACT

Methods to etch features in a substrate with a multi-layered double patterning mask. The multi-layered double patterning mask includes a carbonaceous mask layer, a first cap layer on the carbonaceous mask layer and a second cap layer on the first cap layer. After forming the multi-layered mask, a first lithographically defined pattern is etched into the second cap layer. A double pattern that is a composition of the first lithographically defined pattern etched in the second cap layer and a second lithographically defined pattern is then etched into the first cap layer and the carbonaceous mask layer. The double pattern formed in the carbonaceous mask layer is then transferred to a substrate layer and any portion of the multi-layered mask remaining is then removed.

17 Claims, 9 Drawing Sheets

DOUBLE PATTERNING WITH A DOUBLE LAYER CAP ON CARBONACEOUS HARDMASK

CROSS REFERENCE TO RELATED APPLICATIONS

This application claims the benefit of U.S. Provisional Application No. 60/932,859, filed Jun. 1, 2007, which is hereby incorporated by reference.

BACKGROUND

1. Field

Embodiments of the present invention relate to the electronics manufacturing industry and more particularly to a patterning process enabling a reduced half pitch.

2. Discussion of Related Art

Figure 1A:
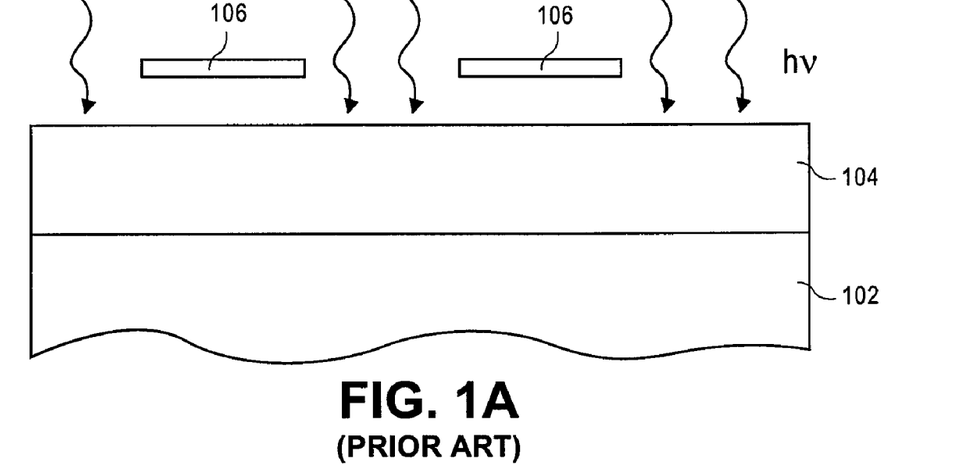
FIG. 1A-1C illustrate a conventional means of biasing a feature to reduce critical dimensions.
Figure 1B:
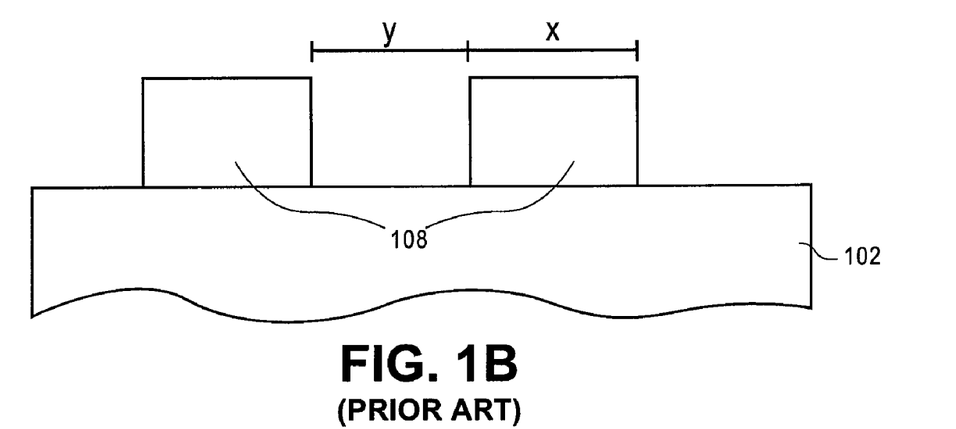
Figure 1C:
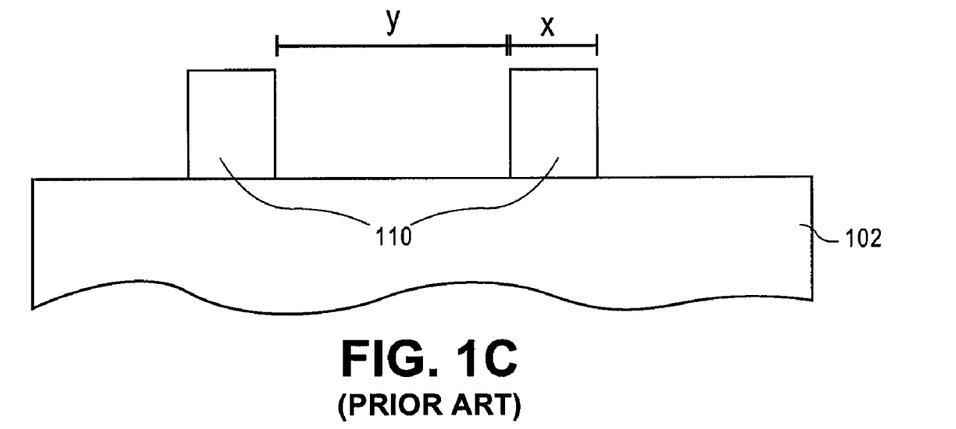

Lithography is used in the manufacture of integrated circuits (ICs). FIGS. 1A-C illustrate cross-sectional views of a conventional semiconductor lithographic process. Referring to FIG. 1A, a photoresist layer 104 is provided above a semiconductor stack 102. A mask or reticle 106 is positioned above photoresist layer 104. A lithographic process includes exposure of photoresist layer 104 to radiation (hv) having a particular wavelength ($\lambda$), as indicated by the arrows in FIG. 1A. Referring to FIG. 1B, photoresist layer 104 is subsequently developed to remove the portions photoresist layer 104 that were exposed to light and thereby provide patterned photoresist layer 108 above semiconductor stack 102. The width of each feature of patterned photoresist layer 108 is depicted by the width 'x' of a feature and the space 'y' between each feature. The width 'x' added to space 'y' is referred to as the pitch, p.

Referring to FIG. 1C, the CD, or width 'x,' of a feature may be reduced to form patterned photoresist layer 110 above semiconductor stack 102. The CD may be shrunk, or "biased" by over-exposing photoresist layer 104 during the lithographic step depicted in FIG. 1A or by trimming patterned photoresist layer 108 provided in FIG. 1B. However, this reduction in feature CD comes at the expense of an increased spacing between features, as depicted by spacing 'y' in FIG. 1C. That is, there is a trade-off between the smallest dimension of the features in patterned photoresist layer 110 and the spacing between these features, thereby making pitch a constant when biasing is employed.

Since biasing a pattern to reduce feature dimensions can not reduce pitch, the critical path for further IC scaling lies with the resolution of the lithographic process. The resolution limit for a particular lithographic process is characterized with features having a critical dimension (CD) equal to the space between the features, i.e. x=y, as depicted in FIG. 1B, with both x and y being equal to the "half-pitch." For example, a particular conventional 193 nm lithography system provides a minimum pitch, p, of 130 nm and a 65 nm half pitch.

Generally, the minimum half pitch may be derived from the Rayleigh resolution equation and is a function of the numerical aperture (NA) of the imaging system, the wavelength ($\lambda$) of the imaging light. Thus, some strategies to advance lithography are based on high NA lithography, such as "hyper-NA" immersion lithography wherein an NA of about 1.3 can be achieved by immersing the imaging optics in water. Still other strategies to advance lithography employ shorter wavelengths, such as extreme ultra-violet (EUV). Progress on these fronts, however, has been slow, hindered by the substantial development and re-tooling required.

As a result, the need to reach the 32 nm half pitch node has arrived before availability of production-worthy systems employing either high refractive index or EUV technology. Density-sensitive product lines, such as flash memory and dynamic random access memory (DRAM) are therefore pursuing double patterning lithography (DPL) as a third strategy to reduce the effective half pitch of patterns formed in a substrate. Generally, the DPL technique successively patterns a substrate twice, each patterning operation performed with a different mask and a relaxed half-pitch. The two resulting patterns interlace to compose features on the substrate having a half pitch smaller than that of either individual pattern. The composition of the two patterns is then transferred into the substrate to define a pattern in the substrate having a half pitch below that lithographically achievable with the particular lithography employed, i.e. "sub-minimum half-pitch."

Because the DPL method is relatively independent of the lithographic technology employed, it can be practiced with existing 193 nm lithography as well as next generation high NA or EUV lithography to provide a sub-minimum half pitch. Thus, DPL will, sooner or later, likely become a fixture in the industry as a means to extend the capabilities of each lithography generation. DPL however is potentially cost prohibitive, particularly as a result of production cycle time, which increases when a DPL integration scheme employs many additional operations to pattern a particular layer. Furthermore, this increase in cycle time is multiplied by each layer requiring a sub-minimum half-pitch. Production cycle time increases are particularly troublesome for product lines which experience significant price erosion over a time period that is only a small multiple of the production cycle time. Thus, the cost-effectiveness of the DPL strategy to advance lithography is highly dependent on integrating the double patterning operations.

SUMMARY

Double patterning methods employing a multi-layered double patterning mask are described herein. In particular embodiments, these methods may be employed to reduce the half-pitch of the features patterned in a substrate layer from either positive or negative tone reticles. In one embodiment of the present invention, the multi-layered mask includes a carbonaceous mask layer, a first cap layer on the carbonaceous mask layer and a second cap layer on the first cap layer. After forming the multi-layered mask, a first lithographically defined pattern is etched into the second cap layer. A double pattern, which is a composition of the first lithographically defined pattern and a second lithographically defined pattern, is then etched into the first cap layer and the carbonaceous mask layer. Finally, the double pattern formed in the first cap layer and carbonaceous mask layer is transferred to a substrate layer and any remaining portion of the multi-layered mask is then removed.

The carbonaceous mask layer provides a mechanically stable mask material capable of delineating features with sub-minimum CD and sub-minimum half-pitch. In one embodiment, the carbonaceous mask layer is resistant to subsequent processing at high temperature, e.g. greater than approximately 250° C. The resistance to higher deposition temperature provides flexibility in tuning characteristics of the cap layer important to DPL, such as, but not limited to deposition rate, etch rate, and optical transparency. The higher deposition temperature also provides greater manufacturing flexibility. In one such embodiment, the carbonaceous mask layer is formed by a chemical vapor deposition (CVD), which may be thermal process or a plasma enhanced process, i.e. plasma enhance chemical vapor deposition (PECVD).

In an embodiment, the carbonaceous mask layer, the first cap layer and the second cap layer are all formed by chemical vapor deposition (CVD) to reduce process complexity, cycle time and costs. In a further embodiment, where both the first cap layer and the second cap layer are formed with a silane ($SiH_4$) precursor, to reduce manufacturing complexity, a single deposition chamber is employed to form the two cap layers successively. In one such embodiment employing CVD carbon, the carbonaceous mask layer, the first cap layer and second cap layer are successively formed within a single cluster tool system.

In an embodiment, the multi-layered mask has adequate transmission to enable alignment of the double patterned layer to previously formed features in the substrate. In a further embodiment, the first cap layer is selected from a material having high transparency in the visible wavelengths used for alignment. A material providing contrast to the first cap layer in visible wavelengths is selected for the second cap layer to enable alignment of the second lithographically defined pattern to the first lithographically defined pattern. The thicknesses of the first and second cap layer are further selected to provide sufficient etch selectivity to each other as well as the carbonaceous mask layer to serve as etch stops and/or etch masks while introducing minimal topography. In one such embodiment, the first cap layer is silicon dioxide and the second cap layer is amorphous silicon. In a particular embodiment, both the first and second cap layers have a thickness between 100 Å and 600 Å.

BRIEF DESCRIPTION OF THE DRAWINGS

Embodiments of the present invention are illustrated by way of example, and not limitation, in the figures of the accompanying drawings in which:

FIGS. 4A-34F illustrate cross sectional views of a double patterning process for a negative tone masking process with reduced half pitch in accordance with one embodiment of the present invention.

FIGS. 5A-5F illustrate cross sectional views of a double patterning process for a positive tone masking process with reduced half pitch in accordance with one embodiment of the present invention.

DETAILED DESCRIPTION

Embodiments of double patterning methods are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding of the present invention. In other instances, well-known semiconductor processes and manufacturing techniques have not been described in particular detail to avoid unnecessarily obscuring the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Figure 2:
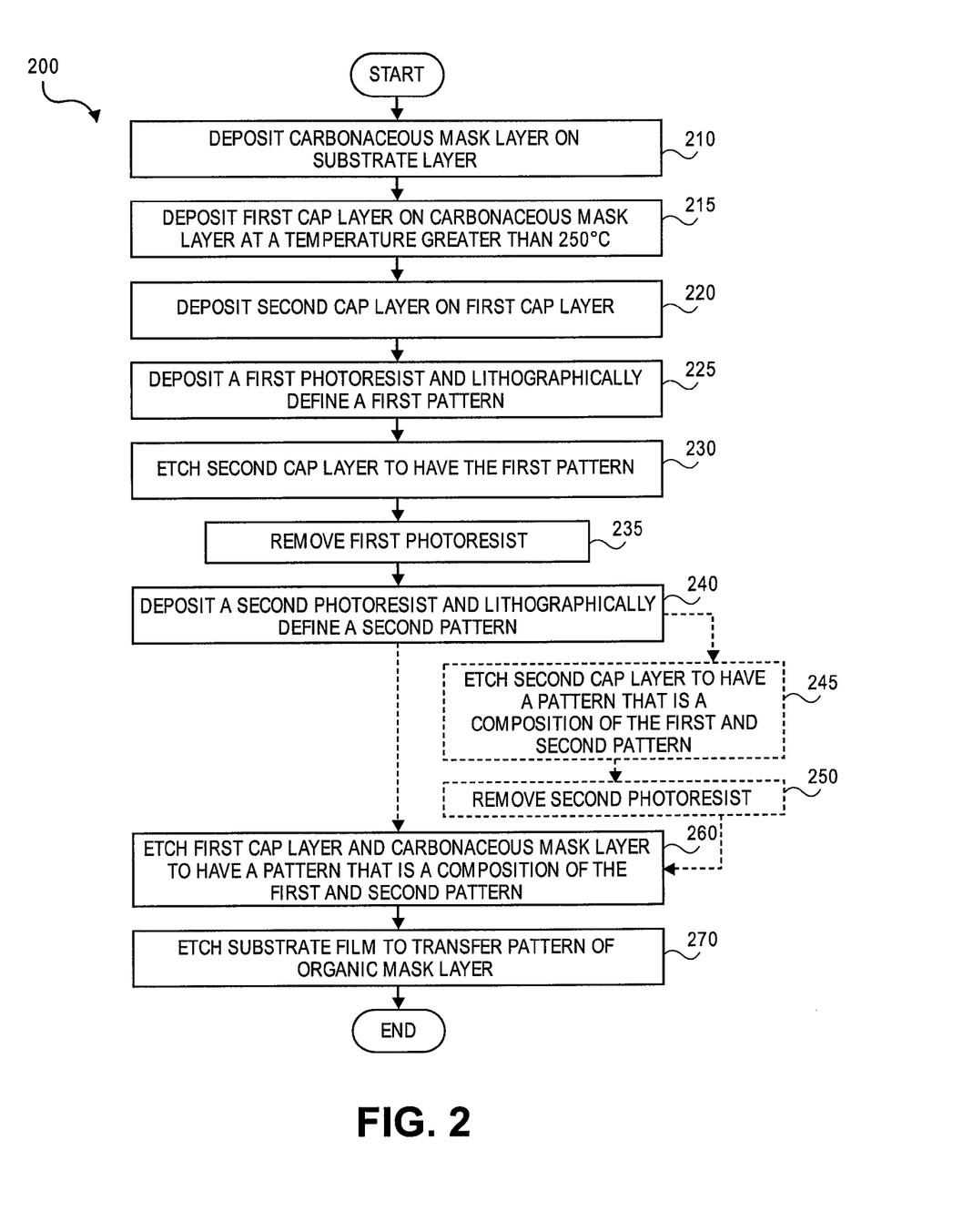
FIG. 2 illustrates a flow chart of a double patterning method for etching a feature in a substrate layer in accordance with a particular embodiment of the present invention.
Figure 3A:
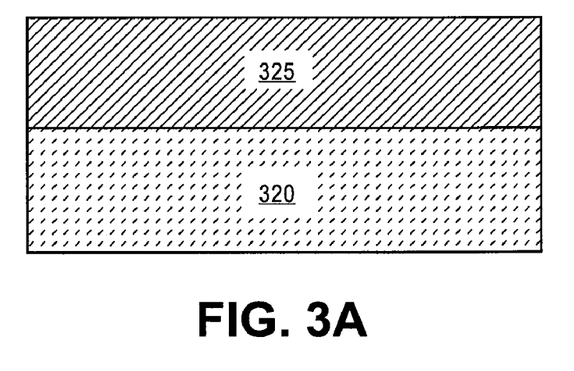
FIGS. 3A-3C illustrate cross sectional views of a double patterning mask in accordance with one embodiment of the present invention.
Figure 3B:
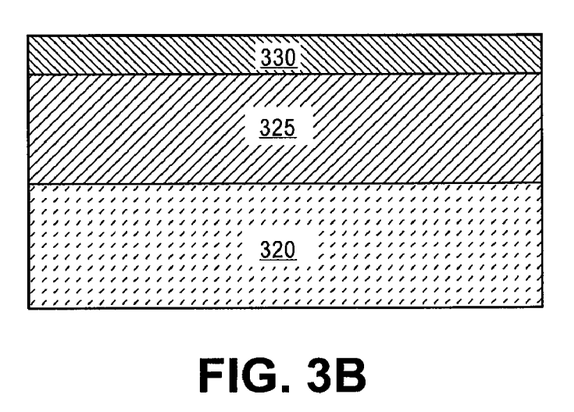
Figure 3C:
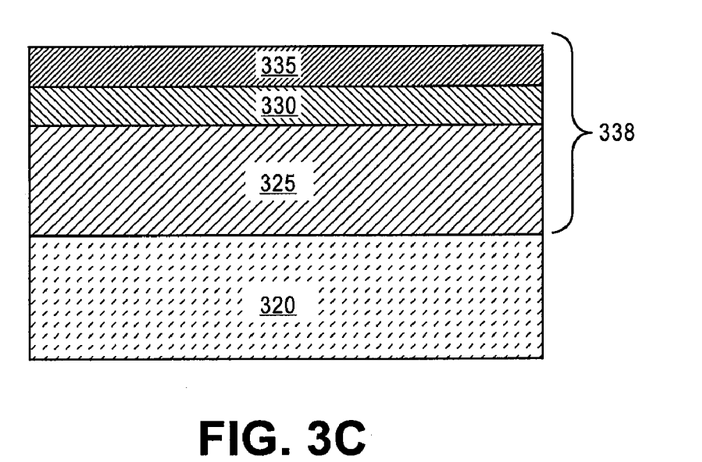

FIG. 2 illustrates a flow chart of double patterning method 200 for patterning a substrate layer using a multi-layered mask comprising a carbonaceous mask layer, a first cap layer, and second cap layer. FIG. 3A-3C illustrate cross-sectional views of an embodiment of the multi-layered mask. In certain embodiments, double patterning method 200 may be employed to reduce the half-pitch of the features patterned in a substrate layer. Generally, double patterning method 200 is universal in that it may be applied to any tone (negative, positive, or double) patterning process. FIGS. 4A-4F illustrate cross-sectional views for a negative tone patterning process with reduced half pitch and are referred to in the description as one embodiment of double patterning method 200 illustrated in FIG. 2. FIGS. 5A-5F illustrate cross-sectional views for a positive tone patterning process with reduced half pitch and are referred to in the description as another embodiment of the double patterning method 200 illustrated in FIG. 2.

Referring to FIG. 2, a carbonaceous mask layer is first deposited at operation 210, then a first cap layer is deposited on the carbonaceous mask layer at operation 215 and then a second cap layer is deposited on the first cap layer at operation 220. After forming the multi-layered mask, the multi-layered mask is then defined. A first photoresist is deposited on the multi-layered mask and lithographically defined at operation 225. This pattern is etched into the second cap layer of the multi-layered mask at operation 230. After this first photoresist is removed at operation 235, a second photoresist is deposited on the multi-layered mask and lithographically defined at operation 235.

Double patterning method 200 then proceeds in a manner dependent on whether the second pattern formed at operation 240 is negative tone (dark field) or positive tone (bright field). These alternate process flows are denoted with dotted arrows in the flow chart of FIG. 2. In a negative tone embodiment, double patterning method 200 proceeds from operation 240 to operation 245 where the second cap layer is etched to have a pattern which is a composition of the first lithographically defined pattern etched in the first cap layer and the second lithographically defined pattern formed in the second photoresist (i.e. a "double pattern"). Following the etch of the second cap layer, the second photoresist is removed. With the photoresist removed, the second cap layer serves as an etch mask and the first cap layer and carbonaceous mask layer of the multi-layered mask are then etched at operation 260 to transfer the pattern of the second cap layer into the carbonaceous mask layer.

Alternatively, for a positive tone embodiment, double patterning method 200 proceeds from operation 240 to operation 260 where the first cap layer and carbonaceous mask layer are etched with a mask composed of the second cap layer (having the first lithographically defined pattern) and the second photoresist (having the second lithographically define pattern). The first cap layer material may therefore be selected to be selectively etchable relative to both photoresist and second cap layer masks. The carbonaceous mask layer, providing a mask for the subsequent substrate layer etch, allows the first cap layer to be relatively thin, further reducing the complexity of etching the first cap layer with a mask composed of photoresist pattern and second cap layer pattern.

With patterning of the multi-layered mask then complete for either a negative or positive tone patterning process, the substrate layer may then be etched at operation 270 with the benefit of the carbonaceous mask layer, and thereby completing double patterning method 200. Thus, double patterning method 200 is generally applicable to any mask tone and provides a high level of integration for superior performance at a reduced cost. As a further illustration of double patterning method 200, specific embodiments are discussed below in greater detail.

The double patterning method 200 of FIG. 2 starts at operation 210 with a carbonaceous mask layer deposited on a substrate layer. Generally the substrate layer is on a supporting substrate (not pictured). In one embodiment, the supporting substrate is a semiconductor wafer, such as, but not limited to silicon, germanium, or a commonly known III-V compound semiconductor material. In another embodiment, the supporting substrate is a glass, such as used in the manufacture of thin film transistors for displays. In still other embodiments, the supporting substrate is quartz, sapphire or other insulative material. Substrate layer 320 generally comprises the layer in which feature is ultimately desired. A substrate layer is distinguished from a mask layer in that a mask layer is a temporary layer employed to transfer a lithographically define pattern into the substrate layer.

As shown in FIG. 3A, substrate layer 320 is the layer into which the desired pattern will ultimately be transferred using double patterning method 200. Substrate layer 320 may itself form sacrificial structures which do not become permanent features of the IC, however in a particular embodiment the features etched into substrate layer 320 are permanent. In an exemplary embodiment, substrate layer 320 is a conductor, such as doped polysilicon or commonly employed metals like aluminum, tantalum, titanium, tungsten, cobalt, nickel and their nitrides. In an alternate embodiment the substrate layer 320 is a dielectric, such as a nitride layer, a silicon dioxide layer, or a layer of a commonly known low-k material, such as carbon doped oxide. In still another embodiment, substrate layer 320 comprises a semiconductor, such as lightly doped silicon, germanium or other commonly known material. In yet another embodiment, the substrate layer may further comprise multiple layers of dielectric and/or semiconductor and/or conductor materials, as commonly known in the art.

Carbonaceous mask layer 325 of FIG. 3A is formed upon substrate layer 320 as the first layer of a multi-layered mask. As used herein, "carbonaceous" refers to a material having more than 50 atomic % carbon. Carbonaceous mask layer 325 is not photosensitive and instead is defined with an anisotropic etch to reproduce with high fidelity the pattern of an overlying photosensitive layer. Carbonaceous mask layer 325 provides the bulk of thickness to the multi-layered double patterning mask, which is advantageous because it can be readily etched with high selectivity to hard mask materials used to transfer the double pattern into the carbonaceous mask and can also provide good mask during subsequent etching of substrate layer 320. Carbonaceous mask layer 325 may also be advantageously removed with the same methods used to remove a photosensitive layer, for example, with a plasma comprising an oxidizing agent and/or a reducing agent. Because no additional mask removal operations are required, process complexity is reduced relative to the traditional hard mask process.

The carbonaceous mask layer 325, once deposited on substrate layer 320, remains stable at temperatures above 250° C. and preferably above 300° C. The resistance to high temperature allows subsequent capping layers to be deposited on carbonaceous mask layer 325 at favorable dielectric deposition temperatures of at least 250° C., discussed further below.

In one particular embodiment, carbonaceous mask layer 325 is CVD carbon. CVD carbon comprises carbon formed by a chemical vapor deposition (CVD), which may be thermal process or a plasma enhanced process, i.e. plasma enhance chemical vapor deposition (PECVD). Generally, the CVD carbon material comprises carbon with sp1, sp2 and sp3 bonding states giving the film properties which are a hybrid of those typical of pyrolylic, graphitic, and diamond-like carbon. Because the CVD carbon material may contain a plurality of bonding states in various proportions, it lacks long rang order and so is commonly referred to as "amorphous carbon." An amorphous carbon material is commercially available from Applied Materials, Inc., CA, U.S.A. under the trade name Advanced Patterning Film™ (APF). In certain embodiments, the amorphous carbon layer is formed with a PECVD process using hydrocarbon precursors, such as, but not limited to, methane ($CH_4$), propylene ($C_3H_6$), propyne ($C_3H_4$), propane ($C_3H_8$), butane ($C_4H_{10}$), butylenes ($C_4H_8$), butadiene ($C_4H_6$), acetelyne ($C_2H_2$) and mixtures thereof. The CVD carbon material may also include nitrogen or other additives.

Carbonaceous mask layer 325 is the thickest layer of the multi-layered double patterning mask. Because the double pattern is eventually transferred into the carbonaceous mask layer, this layer facilitates a high fidelity pattern in substrate layer 320. Carbonaceous mask layer 325 is therefore of sufficient thickness to mask the etch of substrate layer 320 without lowering the transmission % of the multi-layered double patterning mask to a level making pattern alignment difficult.

The carbonaceous mask layer 325 of CVD carbon is formed with a thickness dependent on the optical properties of the material, the material's resistance to the process used to pattern substrate layer 320 and the structural integrity of the CVD carbon material (limiting the aspect ratio of the CVD carbon layer). In one embodiment, the CVD carbon material is deposited to a thickness which is approximately 5 times greater than the feature dimension for an aspect ratio of 5:1. In a further embodiment, the ratio of CVD carbon layer thickness to feature dimension is between 1:1 and 5:1. Such a range of ratios will provide adequate structural integrity so that patterned features will not collapse during subsequent processing. In one such embodiment, where the feature dimension is between 35 nm and 47 nm (45 nm technology node), the CVD carbon layer thickness is between approximately 2000 Å and approximately 8000 Å. In another embodiment, where the feature dimension is between 18 nm and 25 nm (22 mm technology node), the CVD carbon layer thickness is between approximately 500 Å and approximately 2000 Å. The optical properties of the CVD carbon material, such as extinction coefficient (k) and refractive index (n), may be varied through manipulation of the deposition parameters, such as substrate temperature, pre-cursor gas mixture and, for PECVD embodiments, RF power. The carbonaceous mask layer of CVD carbon should have a thickness providing sufficiently high % transmission at common alignment wavelengths that the multi-layered double patterning mask including the first and second cap layers retains sufficiently high percent transmission to facilitate alignment of the lithography operations to a feature defined in or below substrate layer 320.

Herein, the percent transmission relates to a "two pass" model, where light first passes through the CVD carbon layer, is reflected off the substrate layer 320 (or a layer below substrate 320), and then passes back through the CVD carbon layer. In an embodiment, the CVD carbon is formed to a thickness having at least 40% transmission in the visible wavelength range of 500 nm to 900 nm. In a particular embodiment, the PECVD process is tuned to provide a CVD carbon layer with an extinction coefficient, k, measured at 633 nm, of approximately 0.05. In a further embodiment, the CVD carbon layer having a $k_{633\ nm}$ of approximately 0.05 is deposited to a thickness of approximately 3000 Å to provide a % transmission of approximately 55% at 633 nm. As discussed further below, 55% transmission is sufficiently high when coupled with the first and second cap layers of the multi-layered mask to adequately facilitate lithographic alignment with systems using light in the 500 nm-900 nm range.

With the first layer of the multi-layered double patterning mask formed, double patterning method 200 of FIG. 2 proceeds by depositing a first cap layer on the carbonaceous mask layer at a temperature greater than 250° C. Deposition temperatures above 250° C. enable first cap layer to be deposited with a CVD method (thermal or plasma enhanced) that provides advantageous material properties, such as good etch characteristics. Generally, higher temperature films provide better etch resistance and therefore higher etch selectivity is possible relative to other materials. Deposition temperatures above 250° C. are additionally advantageous because such processes can be easily integrated with mainstream deposition processes and tool sets without need to dedicate tools to low temperature processing.

First cap layer 330 shown in FIG. 3B is the second layer of the multi-layered double patterning mask. First cap layer 330 protects the carbonaceous mask layer 325, and as discussed below, further serves as a masking level in positive process embodiments of the double patterning method 200 of FIG. 2. In an embodiment, first cap layer 330 is of a material that may be etched selectivity relative to the carbonaceous mask layer 325, a subsequently deposited second cap layer, and photoresist. In one such embodiment, first cap layer 330 is a dielectric. In an embodiment, first cap layer 330 is formed by CVD with a silane ($SiH_4$) precursor. In a particular embodiment, first cap layer 330 is silicon dioxide formed by CVD. In a further embodiment, first cap layer 330 is silicon dioxide deposited by PECVD with a $SiH_4$ precursor at a temperature greater than 250° C. and preferably greater than 300° C.

As shown in FIG. 3B, first cap layer 330 is generally thinner than that of carbonaceous mask layer 325. First cap layer 330 should have a thickness sufficient to protect carbonaceous mask layer 325 from photoresist removal operations subsequently employed to pattern a second cap layer of the multi-layered mask, as discussed below. The thickness of first cap layer 330 should further provide an adequate etch stop during the subsequent etching of the second cap layer formed on first cap layer 330, as well have a thickness sufficient to mask a subsequent etch of carbonaceous mask layer 325. The thickness of first cap layer 330 may further depend on the optical properties of first cap layer 330. For example, the first cap layer should transmit enough light at the alignment wavelength used for the subsequent lithographic imaging operations that expensive alignment techniques capable of handling low transmission percentages are not required. The optical transmission constraint on the thickness of the first cap layer is also dependent on the optical properties and thicknesses of the carbonaceous mask. Thus, in an embodiment, the thickness of first cap layer 330 is between 100 Å and 600 Å. In a particular embodiment, where carbonaceous mask 325 is CVD carbon having an extinction coefficient, k, of about 0.05 at 633 nm and a thickness to feature ratio of approximately 5:1 for between 500 Å and 8000 Å of CVD carbon, first cap layer 330 is silicon dioxide having an extinction coefficient, k, of approximately 0 at 633 nm, and a thickness of between 300 Å and 450 Å.

Double patterning method 200 of FIG. 2 then proceeds with the formation of a second cap layer on the first cap layer. As depicted in FIG. 3C, second cap layer 335 completes the multi-layered double patterning mask 338 on substrate layer 320. Multi-layered double patterning mask 338, comprising carbonaceous mask layer 325, first cap layer 330 and second cap layer 335, may serve as a universal mask applicable for both positive or negative double patterning process, as discussed further below.

Second cap layer 335 serves as a masking level for the double patterning double patterning method 200 of FIG. 2. Therefore, in an embodiment, second cap layer 335 is formed of a material that provides high etch selectivity relative to the first cap layer 330. In a further embodiment, second cap layer 335 is deposited at a temperature greater than 250° C. As previously discussed in the context of first cap layer 330, deposition temperatures above 250° C. enable the second cap layer to be deposited with a CVD method (thermal or plasma enhanced) that provides advantageous material properties and is advantageous for process integration.

In a particular embodiment, second cap layer 335 provides high contrast to first cap layer 330. High contrast between second cap layer 335 and first cap layer 330 enables a second lithographically defined pattern to be aligned to a first lithographically defined pattern etched into second cap layer 335, as further discussed below. In a particular embodiment, second cap layer 335 and first cap layer 330 over a 2000 Å-8000 Å thick CVD carbon mask layer provides a contrast of between 20% and 40%. With second cap layer 335 of a higher reflectivity than first cap layer 330, high contrast is provided between the first and second cap layer upon etching the first lithographically defined pattern into the second cap layer and exposing first cap layer 330. In one such embodiment, second cap layer 335 is of a material and of a particular thickness providing a reflectivity greater than 30% and preferably greater than 35% while first cap layer is of a material and of a particular thickness providing a reflectivity less than 25% and preferably less than 20%.

In an embodiment, second cap layer 335 is nonmetallic. In one embodiment, second cap layer 335 is formed by CVD with a silane ($SiH_4$) precursor, advantageously enabling both first cap layer 330 and second cap layer 335 to be formed successively in a single deposition chamber. In a further embodiment, where first cap layer 330 is silicon dioxide, second cap layer 335 is amorphous silicon formed by CVD to provide high etch selectivity and high contrast between the first and second cap layer. In one such embodiment, second cap layer 335 is amorphous silicon deposited by PECVD with a $SiH_4$ precursor at a temperature greater than 250° C. and preferably greater than 300° C.

As shown in FIG. 3C, second cap layer 335 is generally thinner than that of carbonaceous mask layer 325. The thickness of second cap layer 335 should be minimized to reduce the amount of topography incurred when a pattern is etched into the second cap layer to facilitate good focus during a second lithographic operation. In a specific embodiment, the thickness of second cap layer is therefore less than 600 Å. Second cap layer 335 should further be of a thickness sufficient to mask first cap layer 330 during subsequent patterned etching of the first cap layer. In a specific embodiment, the thickness of second cap layer is therefore greater than 100 Å.

The thickness of second layer 335 may further depend on the optical properties of second layer 335. For example, the second cap layer should transmit enough light at the alignment wavelength used for a subsequent lithographic imaging operation does not require expensive alignment techniques capable of handling low transmission percentages. Because the double patterning mask is multi-layered, the optical transmission constraint on the thickness of second cap layer is further dependent on the optical properties and thicknesses of both the first cap layer and carbonaceous mask. Thus, in an embodiment, the thickness of second cap layer 335 is between 100 Å and 600 Å. In a particular embodiment, employing a carbonaceous mask layer 325 of CVD carbon having an extinction coefficient, k, of approximately 0.05 at 633 nm and a thickness of 3000 Å, a first cap layer 330 of silicon dioxide having an extinction coefficient, k, of approximately 0 at 633 nm and a thickness of 300 Å, the thickness of second cap layer 335 is approximately 300 Å to provide a cumulative multi-layered mask transmission % of 36%.

With the multi-layered double patterning mask 338 of FIG. 3C completed, double patterning method 200 of FIG. 2 proceeds at operation 225 with depositing a photoresist and lithographically defining a first pattern in the photoresist. In an embodiment, the photoresist deposited is a conventional acrylate composition with a thickness between 500 Å and 6000 Å. In an alternate embodiment, the photoresist is siloxane and silsesquioxane (SSQ) based with a thickness between 1000 Å-2000 Å. A bottom anti-reflective coating (BARC) may also be applied in conjunction with the photoresist. BARC is generally a spin-on material, applied prior to the photoresist, comprising an organic functional group, such as, but not limited to, polyamides, polysulfones, and others including inorganic backbones, such as organosiloxane.

Depending on the tone of a particular reticle (positive, negative, or double), a feature (line, opening, both lines and openings) is lithographically defined in the photoresist. In particular embodiments, the lithography process is biased to shrink the CD of the defined feature to "sub-minimum" using conventional techniques, such as but not limited to over/under exposure. Multi-layered double patterning mask 338 of FIG. 3C may be used for any tone and is therefore a universal double patterning mask applicable for both negative and positive process embodiments. In a negative process embodiment, shown in FIG. 4A, photoresist 440 is patterned with a conventional 193 nm expose/develop lithography process to define a first pattern of photoresist openings 445 in photoresist 440 masking second cap layer 435, first cap layer 430, carbonaceous mask layer 425 and substrate layer 420. As previously discussed, embodiments of the multi-layered double patterning mask 338 provide a high % transmission so that photoresist openings 445 may be aligned to a feature below substrate layer 420. In a positive process embodiment, shown in FIG. 5A, a photoresist is patterned with a conventional 193 nm expose/develop lithography process to define a first pattern of photoresist lines 540 masking second cap layer 435, first cap layer 430, carbonaceous mask layer 425 and substrate layer 420.

Next, double patterning method 200 proceeds at operation 230 with etching the second cap layer of the multi-layered double patterning mask to form the first pattern in the second cap layer and then removing the first photoresist at operation 235. The process employed to etch the second cap layer has selectivity greater than 1:1, thereby etching the second cap layer at a greater rate than the first cap layer to ensure the etch process stops on the first cap layer. In one embodiment employing an amorphous silicon second cap layer, a conventional plasma etch process utilizing a process gas, such as but not limited to, sulfur hexafluoride (SF6), chlorine (Cl), or hydrogen bromide (HBr) is employed to etch the second cap layer selectively to the first cap layer. Removal of the photoresist at operation 235 is done by conventional means, such as, but not limited to, plasma oxidation and/or piranha clean.

Figure 4A:
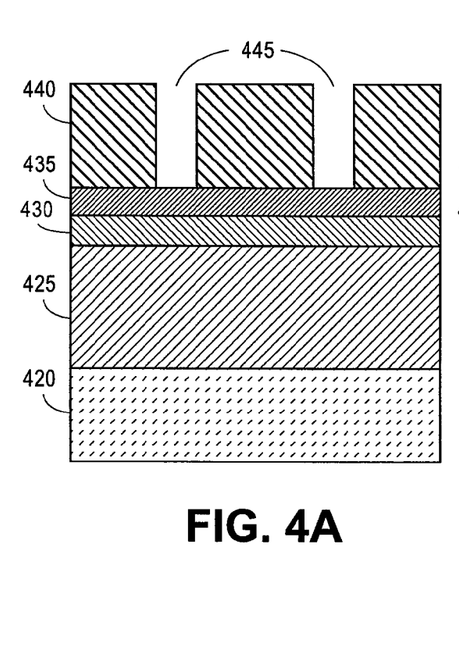
Figure 4B:
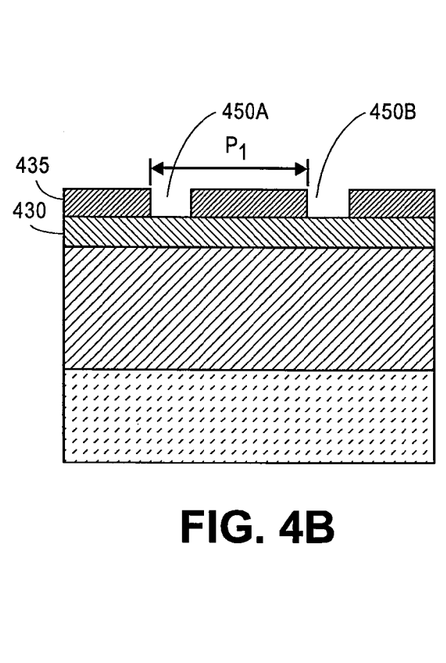
Figure 5A:
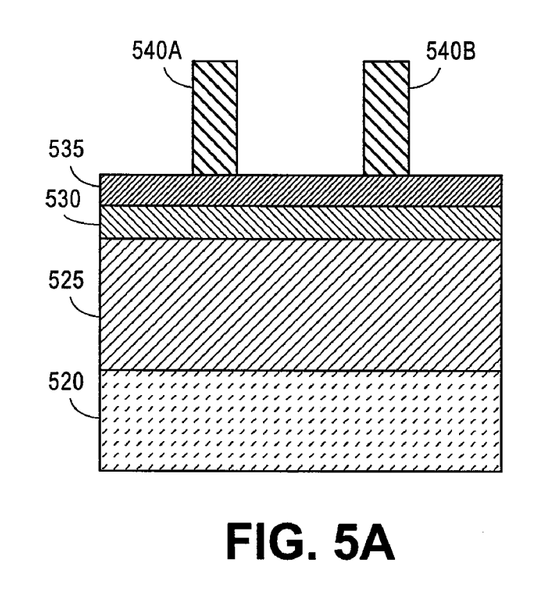
Figure 5B:
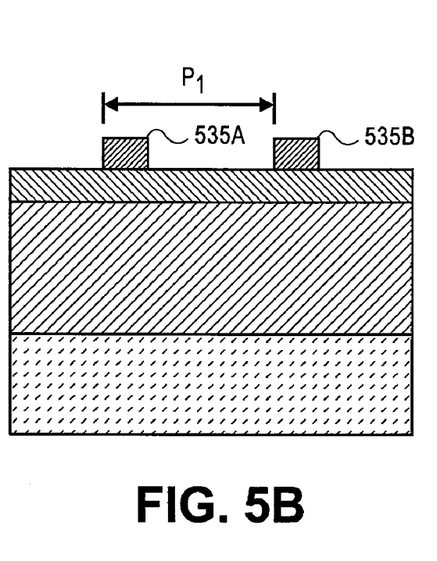

In particular embodiments, the process employed to etch the second cap layer shrinks the CD of an etched feature to "sub-minimum" using conventional biasing techniques, such as, but not limited to, polymer deposition and resist trimming. In a negative process embodiment, as shown in FIG. 4B, openings 450A and 450B are etched into second cap layer 435. In one such embodiment, a polymerizing etch process is used to reduce the CD of the openings 450A and 450B relative to the photoresist openings. In a particular embodiment, the polymerizing etch process utilizes a plasma chemistry of $SF_6$, Cl, and nitrogen ($N_2$). In a further embodiment, the lithographic process of FIG. 4A and etch process of 4B combine to provide a first pattern in second layer 435 having a pitch $P_1$ comprising a 1:3 opening to space ratio. In a positive etch process embodiment, as shown in FIG. 5B, lines 535A and 535B are etched into second cap layer 535. In one such embodiment, a commonly known resist trimming etch process is used to reduce the CD of photoresist lines 540A and 540B prior to etching features 535A and 535B. In a particular embodiment, the lithographic process of FIG. 5A and etch process of 5B combine to provide a first pattern in second layer 535 having a pitch $P_1$ comprising a 1:3 line to space ratio.

With a first pattern etched in the second cap layer, double patterning method 200 of FIG. 2 proceeds with depositing a second photoresist and lithographically defining a second pattern in the photoresist at operation 240. The photoresist and lithographic processes used may be any conventional process and in a particular embodiment, the same processes used in operation 225 are employed at operation 240. Referring to the negative process embodiment depicted in FIG. 4C, photoresist opening 460 is formed over second cap layer 435 and aligned relative to openings 450A and 450B. Just as in operation 225 of FIG. 2, the lithographic process may be biased to reduce the CD of photoresist opening 460. In the particular embodiment depicted, photoresist opening 460 is aligned to be between openings 450A and 450B. As previously discussed, openings 450A and 450B cause little topography in embodiments where second cap layer has a thickness less than 600 Å. Therefore, photoresist opening 460 may be formed with high fidelity. Furthermore, alignment of photoresist opening 460 to openings 450A and 450B may also be facilitated in embodiments having a high contrast between second cap layer 435 and first cap layer 430. For example, openings 450A and 450B, exposing a first cap layer 430 of silicon dioxide that is substantially less reflective than a second cap layer 435 of amorphous silicon, enable alignment of photoresist opening 460 to the openings 450A and 450B rather than requiring photoresist opening 460 to be alignment back to a feature below substrate layer 420. This ability to align the second lithographically defined pattern to the first lithographically defined pattern (intra-layer alignment) advantageously reduces cumulative overlay error between openings 450A/450B and photoresist opening 460.

Figure 5C:
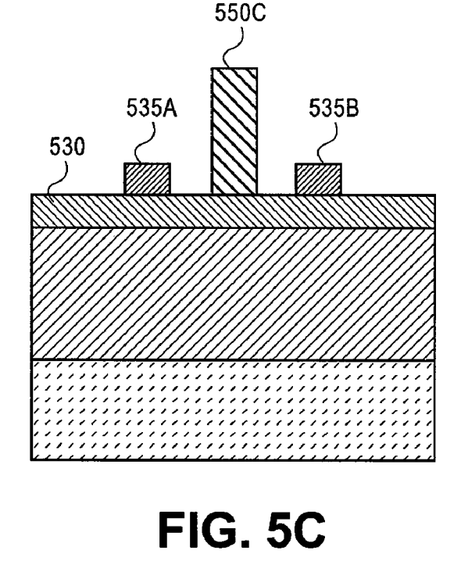

Similarly, for the positive process embodiment depicted in FIG. 5C, line 550C is aligned between lines 535A and 535B. Because most of the second cap layer is removed in the positive process, the second lithographically defined pattern is formed on first cap layer 530. Here too, the lithographic process may employ conventional biasing techniques to reduce the CD of line 550C. High contrast between first cap layer 530 and lines 535A and 535B facilitate alignment of the second lithographic process defining line 550C to lines 535A and 535B.

Figure 4C:
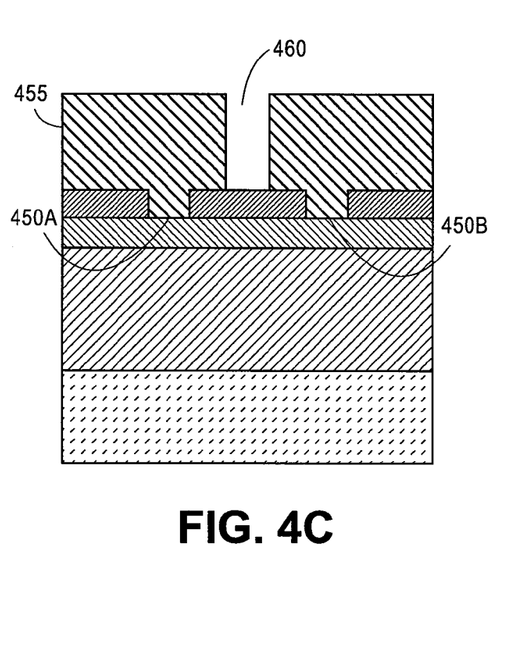
Figure 4D:
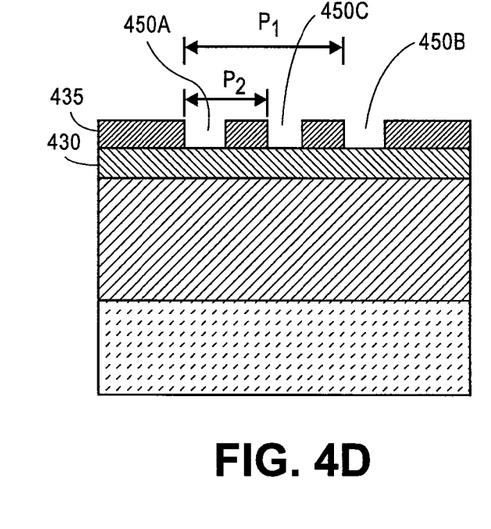

Following operation 240, the flow chart of double patterning method 200 in FIG. 2 depicts alternate pathways for defining the remainder of the multi-layer double patterning mask. The specific pathway depends on whether the multi-layered double pattern mask is employed in a negative or positive process (indicated by the dashed lines). For the negative process, double patterning method 200 proceeds with operation 245 with a further etch of the second cap layer to form in the second cap layer a pattern that is a composition of the first and second lithographically operations 225 and 240 (i.e. a double pattern). In the embodiment shown in FIG. 4D, opening 450C, defined by the photoresist opening 460 of FIG. 4C, is etched into second cap layer 435. The etch process may, as previously described for operation 230 of FIG. 2, reduce the CD of opening 450C relative to photoresist opening 460. In the particular embodiment where the openings 450A and 450B have an opening to space ratio of 1:3, pitch $P_2$ between opening 450A and 450C is half the pitch $P_1$ between opening 450A and 450B to provide a double patterned mask having openings with sub-minimum CD and a sub-minimum half pitch. As shown in FIG. 4D, photoresist 455 is removed with conventional processing following the second etch of second cap layer 435 (at operation 250 of FIG. 2) to leave first cap layer 430 masked only by second cap layer 435. First cap layer 430 remains in tact to protect carbonaceous mask layer 425 from the process employed to remove photoresist 455.

Figure 4E:
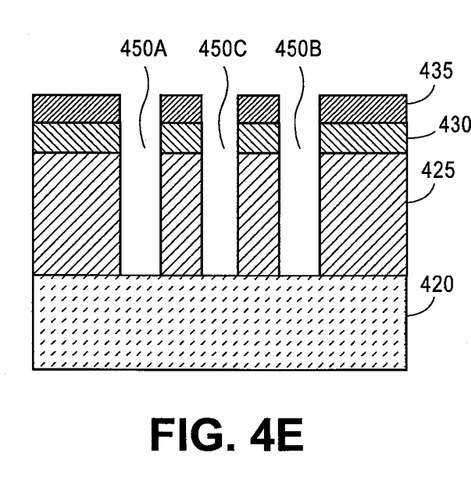
Figure 4F:
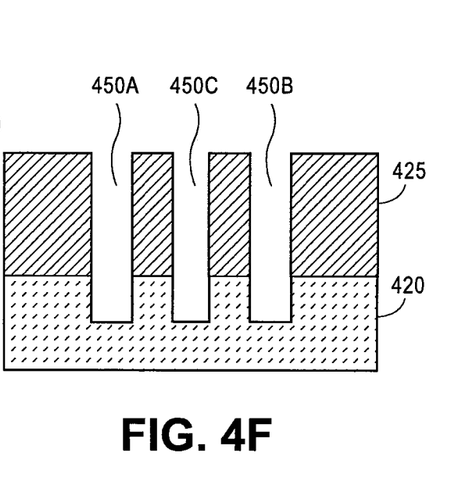

The negative process embodiment then proceeds from operation 250 to operation 260 of double patterning method 200 in FIG. 2 to complete definition of the multi-layered double patterning mask. The embodiment of FIG. 4E depicts defining first cap layer 430 and carbonaceous mask layer 425 with conventional etch processes using second cap layer 435 as a mask. Commonly known plasma etch processes may be employed depending on the composition of first cap layer 430. In a particular embodiment employing a silicon dioxide first cap layer, the etch process may include octafluorocyclobutane ($C_4F_8$), octafluorocyclopentene ($C_5F_8$), hexafluorobenzene ($C_6F_6$), hexafluorobutadiene ($C_4F_6$), hexafluorocyclobutanone ($C_4F_6O$), difluoromethane ($CH_2F_2$) and trifluoromethane ($CHF_3$).

Carbonaceous mask layer 425 is then defined with an etch process. In a specific embodiment, where carbonaceous mask layer 425 is comprised of a CVD carbon film, a plasma etch employs gases selected from the group consisting of oxygen ($O_2$) and $N_2$ and other nitrogen oxides and $CH_4$, The multi-layered double patterning mask is then completely defined and prepared to define a pattern in substrate layer 420.

Returning to the positive process embodiment, definition of the multi-layered double patterning mask proceeds from operation 240 to operation 260 in FIG. 2. The first cap layer and carbonaceous mask layer are etched at operation 260 to have a pattern that is a composition of the first and second patterns lithographically defined in operations 225 and 240 (i.e. double pattern). In the embodiment shown in FIG. 5D, photoresist line 550C of FIG. 5C is etched into first cap layer to form first cap line 530C. Conventional plasma etch processes may be employed depending on the composition of first cap layer 530. In a particular embodiment employing a silicon dioxide first cap layer, the etch process may include any of those described above in the negative process embodiment. The etch process may also, as previously described for operation 230 of FIG. 2, first reduce the CD of photoresist line 550C relative to the printed dimensions. In the particular embodiment where the second cap lines 535A and 535B have a line to space ratio of 1:3, pitch $P_2$ between second cap line 535A and first cap line 530C is half the pitch $P_1$ between lines second cap lines 535A and 535B to provide a double patterned mask with lines having sub-minimum CD and sub-minimum half pitch. In the embodiment shown in FIG. 5D, there is a first mask stack formed of photoresist line 550C and first cap line 530C and a second mask stack formed of second cap line 535A on first cap line 530A. Thus, in this embodiment, a hybrid mask is provided for the etching of carbonaceous mask layer 525.

Figure 5D:
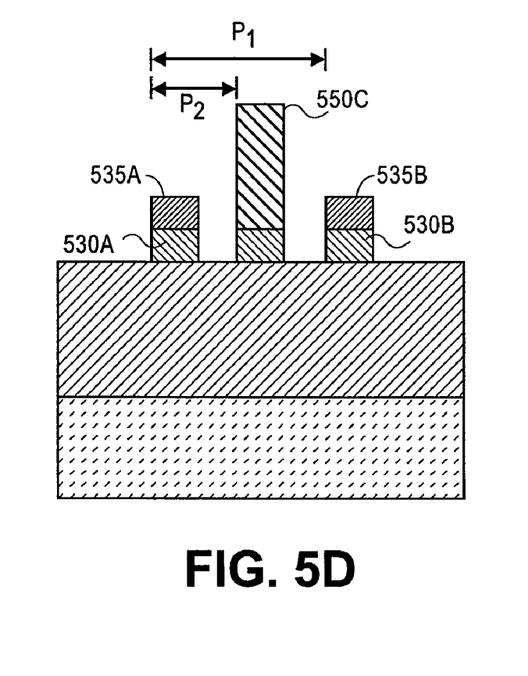
Figure 5E:
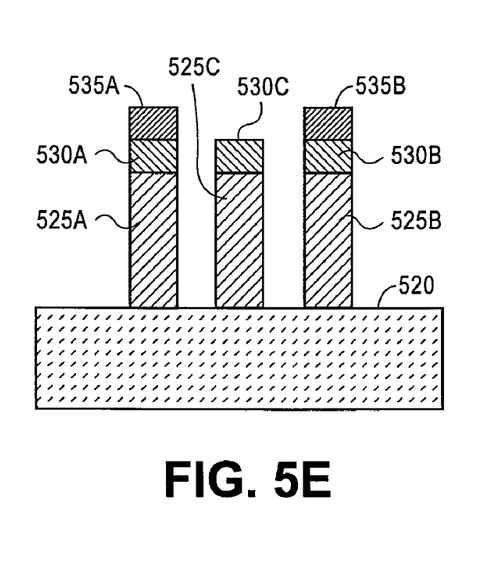
Figure 5F:
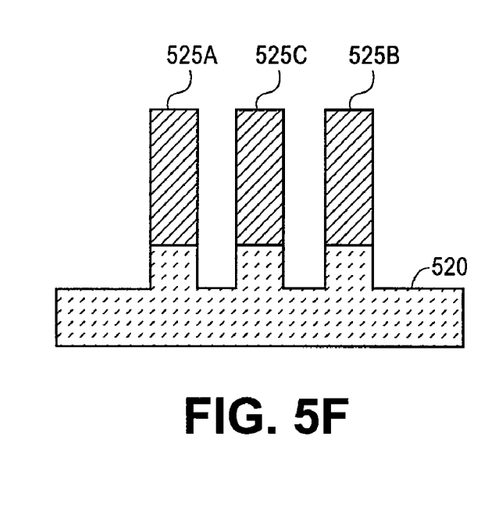

Continuing with the positive process embodiment shown in FIG. 5E, carbonaceous mask layer 525 is etched using the hybrid mask formed in FIG. 5D to complete the definition of the multi-layered double patterning mask. In the embodiment depicted, photoresist line 550C is consumed during the etch of carbonaceous mask layer 525. Similar erosion of the second cap lines 535A and 535B may also occur, as long as the remaining portions of first cap lines 530A, 530B and 530C are sufficient to etch the double pattern with high fidelity to form carbonaceous lines 525A, 525B and 525C. Conventional plasma etch processes may be employed to define carbonaceous mask layer 525 into carbonaceous lines 525A, 525B and 525C with high selectivity to first cap line 530C as wells as second cap lines 535A and 535B and/or first cap lines 530A and 530B. In a specific embodiment, where carbonaceous mask layer 525 is comprised of a CVD carbon film, a plasma etch employing gases selected from the group consisting of oxygen ($O_2$) and $N_2$ and other nitrogen oxides and $CH_4$ and $N_2$ and $O_2$ and other nitrogen oxides.

Finally, masked by the carbonaceous mask layer of the multi-layered mask, the substrate layer is etched with the double pattern. For the negative process, shown in FIG. 4F, substrate layer 420 is etched with conventional techniques selective to carbonaceous mask layer 425, depending on the material composition of substrate layer 420. In a particular embodiment, substrate layer 420 is a dielectric and is etched with conventional fluorine-based plasma processes. In the embodiment shown in FIG. 4F, during the etch of substrate layer 420, remaining portions of second cap layer 435 and/or first cap layer 530 are consumed.

For the positive process embodiment, substrate layer 520 is etched with conventional techniques selective to carbonaceous lines 525A, 525B and 525C, depending on the material composition of substrate layer 520. Because all mask lines now contain a single material (the carbonaceous mask layer), selectivity constraints on the etch of substrate layer 520 are relaxed. In a particular embodiment, substrate layer 520 is a polysilicon and is etched with conventional $Cl_2$/HBr based plasma processes. In the embodiment shown in FIG. 5F, during the etch of substrate layer 520, second cap lines 535A and 535B and/or first cap lines 530A, 530B and 530C are consumed.

Thus, the carbonaceous mask layer of the multi-layered double patterning mask facilitates formation of a high fidelity pattern in substrate layer 520 to complete double patterning method 200 of FIG. 2. In further embodiments, the double patterning technique herein described facilitates etching a high fidelity pattern into substrate layer having a half pitch and reduced feature critical dimension with minimal processing overhead. With the pattern transferred to the substrate layer, any portion of the multi-layered mask remaining is then removed.

In an embodiment, the CVD processes of double patterning method 200 are performed in a PECVD deposition chamber, such as the DXZ™ and XT Producer™, manufactured by and commercially available from Applied Materials of CA, USA.

Figure 6:
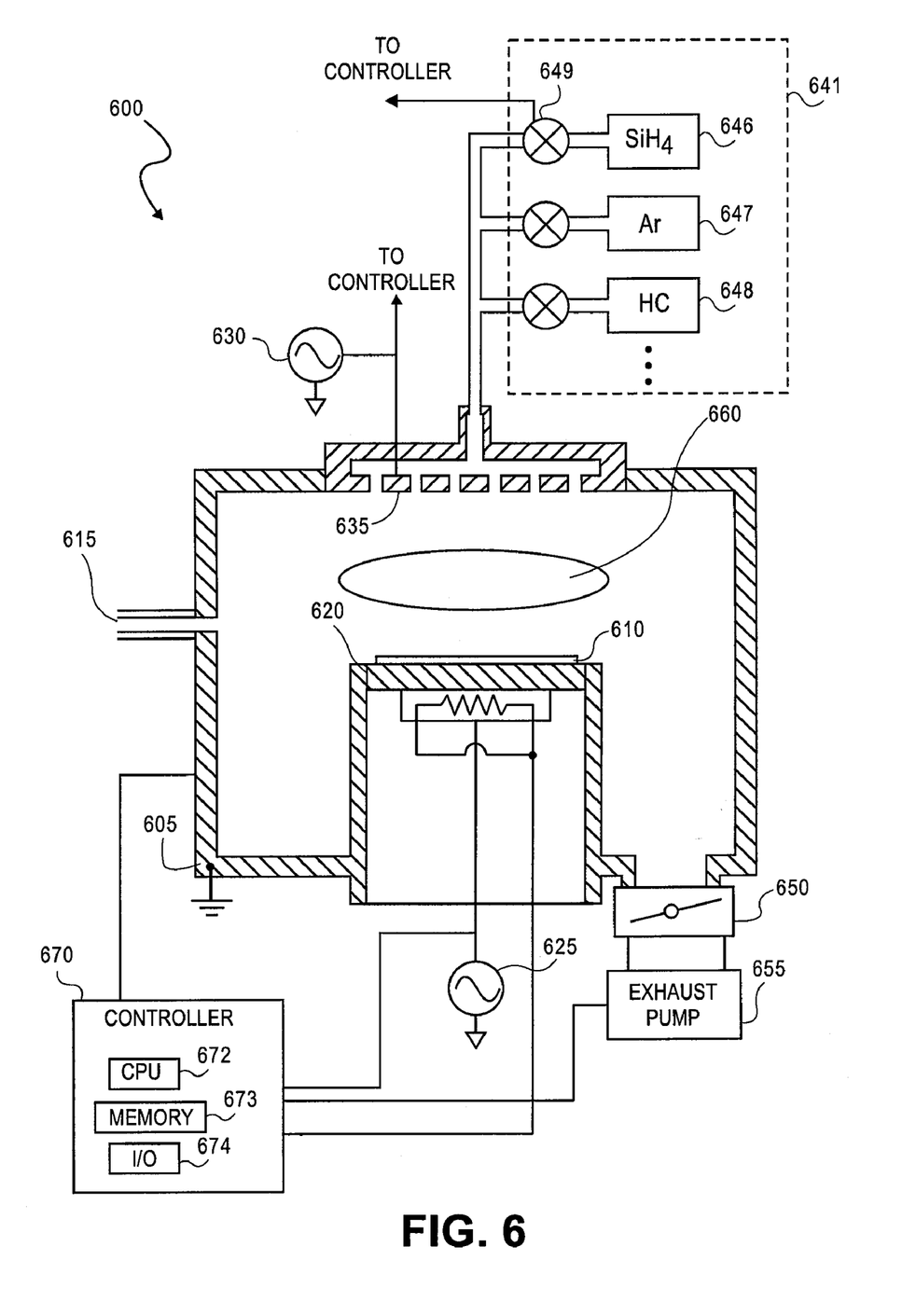
FIG. 6 illustrates a schematic of a deposition chamber employed in an embodiment of the present invention.

It is to be understood that other CVD chambers can be used for practicing embodiments of the present invention. A cross-sectional view of an exemplary deposition chamber 600 is shown in FIG. 6. Deposition chamber 600 includes a process chamber 605. A substrate 610 is loaded through an opening 615 and placed on a temperature controlled pedestal 620. Pedestal 620 may further move in a vertical direction inside process chamber 605. Process gases, such as SiH$_4$, argon (Ar), and/or a hydrocarbon (HC) are delivered in the formation of an embodiment of the multi-layered double patterning mask previously described. The process gases are supplied from sources 646, 647 and 648, respectively, contained within a gas panel 641. The process gases are supplied from the source through respective mass flow controllers 649 to the interior of the process chamber 605. Liquid precursors may be vaporized and delivered to process chamber 604 with a carrier gas. The carrier gas is generally inert, such as helium (He), N$_2$, or Ar. Chamber 605 is evacuated via an exhaust valve 650 connected to a high capacity vacuum pump stack 655.

Showerhead 635 and pedestal 620 form a pair of electrodes. When radio frequency (RF) power is applied, process gas within process chamber 605 is ignited by the fields formed between the pair of electrodes to form plasma 660. Generally, an electric field is produced by coupling pedestal 620 to a source 625 of single or double frequency RF. Alternatively, RF source 630 may be coupled to showerhead 635 or both RF sources 630 and 625 may be employed.

In an embodiment of the present invention, CVD deposition chamber 600 is computer controlled by controller 670 to control the RF power, gas flows, pressure, pedestal temperature, as well as other process parameters. Controller 670 may be one of any form of general-purpose data processing system that can be used in an industrial setting for controlling the various subprocessors and subcontrollers. Generally, controller 670 includes a central processing unit (CPU) 672 in communication with memory 673 and input/output (I/O) circuitry 674, among other common components. Software commands executed by CPU 672, cause deposition chamber 600 to deposit a first cap layer and a second cap layer in succession using a SiH$_4$ process gas at a pedestal temperature greater than 300° C. In another embodiment, software commands executed by CPU 672, cause deposition chamber 600 to deposit a first cap layer of 100 Å-600 Å (preferably 300 Å-450 Å) silicon dioxide and a second cap layer of 100 Å-600 Å (preferably 300 Å-450 Å) amorphous silicon in succession using a SiH$_4$ process gas at a pedestal temperature greater than 300° C. In one embodiment, software commands executed by CPU 672 may alternatively cause deposition chamber 600 to deposit CVD carbon layers with a hydrocarbon process gas. In one embodiment, software commands executed by CPU 672, cause deposition chamber 600 to deposit a 500 Å-8000 Å CVD carbon layer.

Portions of the present invention may be provided as a computer program product, which may include a computer-readable medium having stored thereon instructions, which when executed by a computer (or other electronic devices), cause a process chamber to deposit a 500 Å-8000 Å CVD carbon layer. In other embodiments, a computer-readable medium has stored thereon instructions, which when executed by a computer (or other electronic devices), cause a process chamber to deposit on a CVD carbon layer a first cap layer and a second cap layer in succession using a SiH$_4$ process gas at a pedestal temperature greater than 300° C. In a further embodiment, a computer-readable medium has stored thereon instructions, which when executed by a computer (or other electronic devices), cause a process chamber to deposit on a 500 Å-8000 Å CVD carbon layer, a 100 Å-600 Å (preferably 300 Å-450 Å) silicon dioxide first cap layer and then deposit on the silicon dioxide first cap layer a 100 Å-600 Å (preferably 300 Å-450 Å) amorphous silicon second cap layer using a SiH$_4$ process gas and a pedestal temperature greater than 300° C. The computer-readable medium may include, but is not limited to, floppy diskettes, optical disks, CD-ROMs (compact disk read-only memory), and magneto-optical disks, ROMs (read-only memory), RAMs (random access memory), EPROMs (erasable programmable read-only memory), EEPROMs (electrically-erasable programmable read-only memory), magnet or optical cards, flash memory, or other commonly known type computer-readable medium suitable for storing electronic instructions. Moreover, the present invention may also be downloaded as a computer program product, wherein the program may be transferred from a remote computer to a requesting computer over a wire.

Figure 7:
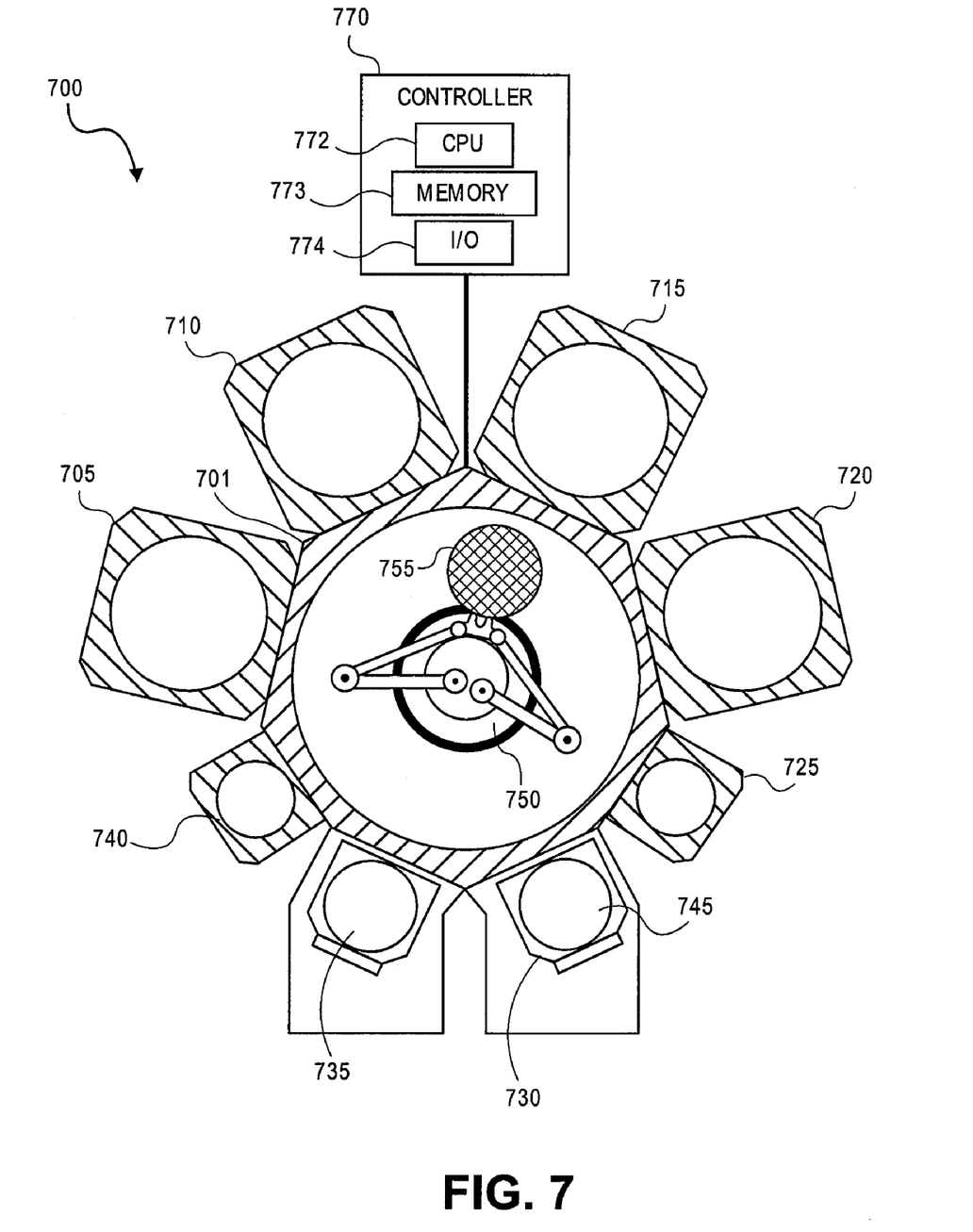
FIG. 7 illustrates a schematic of a cluster tool system employed in an embodiment of the present invention.

FIG. 7 depicts an exemplary conventional cluster tool system 700, for executing deposition steps forming the multi-layered double patterning mask as describe herein. A cluster tool advantageously enables multiple processing steps to occur under continuous vacuum and reduce processing cycle time associated with forming the multi-layer double patterning mask described herein. Therefore, it is envisioned certain processing steps of the double patterning method described herein may be executed with a cluster tool, such as, for example, a Centura™ system commercially available from Applied Materials, Inc. of Santa Clara, Calif.

Cluster tool system 700 included process chambers 705, 710, 715 and 720, each coupled to a transfer chamber 701. Substrate aligner chambers 740 and 725, as well as load lock chambers 730, are further coupled to transfer chamber 701. Process chambers 705, 710, 715 and 720 may perform certain steps of the present invention, such as CVD carbon layer deposition and/or etch, silicon dioxide deposition and/or etch, and amorphous silicon deposition and/or etch. Suitable deposition chambers include DxZ™ and XT Producer™, previously described. Suitable etch chambers include EMax™, and Enabler™, both commercially available from Applied Materials, Inc. of Santa Clara, Calif. Other plasma deposition or etch chambers may be used in practicing aspects of the present invention.

During processing, substrate 755 is transferred among any of the chambers coupled to transfer chamber 701 by way of robotic handler 750. In an embodiment of the present invention, cluster tool system 700 is computer controlled by controller 770 to control the transfer of substrate 755 between various processing chambers, load locks, etc. Controller 770 may be one of any form of general-purpose data processing system that can be used in an industrial setting for controlling the various subprocessors and subcontrollers. Generally, controller 770 includes a central processing unit (CPU) 772 in communication with memory 773 and input/output (I/O) circuitry 774, among other common components. In an embodiment, software commands executed by CPU 772, cause robotic handler 750 to pick substrate 755 from cassette 735 or 745, transfer substrate 755 to aligner 725, and then transfer substrate 775 to a first deposition chamber where a CVD carbon mask layer of between 500 Å and 8000 Å is deposited on a substrate layer of substrate 755. In a further embodiment, software commands executed by CPU 772, cause robotic handler 750 to transfer substrate 755 to a second deposition chamber when a 100 Å-600 Å (preferably 300 Å-450 Å) silicon dioxide first cap layer is deposited on the CVD carbon layer and a 100 Å-600 Å (preferably 300 Å-450 Å) amorphous silicon layer is deposited on the silicon dioxide layer.

Following completion of processing, robotic handler 750 is transferred to cool down station 740 and then placed in cassette 735 or 745.

Although the present invention has been described in language specific to structural features and/or methodological acts, it is to be understood that the invention defined in the appended claims is not necessarily limited to the specific features or acts described. The specific features and acts disclosed are to be understood as particularly graceful implementations of the claimed invention in an effort to illustrate rather than limit the present invention.

What is claimed is:

1. A double patterning method comprising:
    forming on a substrate a multi-layered mask including a carbonaceous mask layer, a first cap layer on the carbonaceous mask layer and a second cap layer on the first cap layer, wherein the first cap layer is silicon dioxide formed at a temperature above 250° C. and wherein the second cap layer is amorphous silicon;
    etching a first lithographically defined pattern into the second cap layer, stopping on the first cap layer, to form two features in the second cap layer;
    forming a photoresist layer over the second cap layer and contacting the first cap layer;
    lithographically defining in the photoresist layer a third feature disposed between the two features;
    etching the third feature to form a double pattern comprising the three features into the first cap layer and the carbonaceous mask layer;
    etching the double pattern into the substrate; and
    removing any remaining portion of the multi-layered mask.

2. The method of claim 1, wherein the carbonaceous mask layer comprises a CVD carbon material.

3. The method of claim 1, wherein the first cap layer and the second cap layer are both formed with a silane precursor.

4. The method of claim 1, wherein the first cap layer and second cap layer are successively deposited within a single deposition chamber.

5. The method of claim 1, wherein the two features formed in the second cap layer are openings etched selectively to the first cap layer and wherein etching the third feature comprises etching a third opening into the second cap layer, stopping on the first cap layer, to form the double pattern in the second cap layer.

6. The method of claim 5, further comprising:
    removing a photoresist layer masking the second cap layer prior to etching the double pattern into the first cap layer and the carbonaceous mask layer.

7. The method of claim 1, further comprising:
    removing a photoresist layer masking the first cap layer during the etching of the double pattern into the carbonaceous mask layer.

8. The method of claim 1, wherein the first lithographically defined pattern is aligned to a feature of the substrate and the third feature is aligned to a feature of first lithographically defined pattern.

9. The method of claim 1, wherein the first lithographically defined pattern etched into the second cap layer has a feature to space ratio of 1:3 and the double pattern etched into the first cap layer and the carbonaceous mask layer has a feature to space ratio of 1:1.

10. A CVD method of forming a highly transmissive multi-layered mask comprising:
    depositing a CVD carbon layer at least 3000 Å thick on a substrate, wherein the CVD carbon layer has an extinction coefficient of 0.05 at 633 nm;
    depositing a silicon dioxide layer 300-450 Å thick on the CVD carbon layer;
    depositing an amorphous silicon layer 300-450 Å thick on the silicon dioxide layer.

11. The method of claim 10, wherein the silicon dioxide layer has an extinction coefficient of 0 at 633 nm.

12. The method of claim 11, wherein the silicon dioxide layer and the amorphous silicon layer are each deposited with a with a silane precursor.

13. The method of claim 10, wherein the first cap layer and the second cap layer are successively formed within a single deposition chamber.

14. The method of claim 10, wherein the carbonaceous mask layer, first cap layer and second cap layer are successively formed within a single cluster tool system.

15. A non-transitory computer-readable medium having stored thereon a set of machine-executable instructions that, when executed by a data-processing system, cause a system to perform a method comprising:
    depositing a CVD carbon layer at least 3000 Å thick on a substrate, wherein the CVD carbon layer has an extinction coefficient of 0.05 at 633 nm;
    depositing a silicon dioxide layer 300 Å and 450 Å thick on the CVD carbon layer; and
    depositing an amorphous silicon layer 300 Å and 450 Å thick on the silicon dioxide layer.

16. The computer-readable medium of claim 15, comprising a set of machine-executable instructions that, when executed by a data-processing system, cause a system to perform a method wherein the CVD carbon layer is deposited to a thickness of between 500 Å and 8000 Å.

17. The computer-readable medium of claim 15, comprising a set of machine-executable instructions that, when executed by a data-processing system, cause a system to perform a method further comprising:
    removing the substrate from a first CVD chamber of the system after depositing the CVD carbon layer; and
    providing the substrate to a second CVD chamber of the system and depositing the silicon dioxide layer.

\* \* \* \* \*